(12) United States Patent
Descure

(10) Patent No.: US 6,960,799 B2
(45) Date of Patent: Nov. 1, 2005

(54) IMAGE SENSOR WITH A PHOTODIODE ARRAY

(75) Inventor: Pierrick Descure, Saint Ismier (FR)

(73) Assignee: STMicroelectronics A.A., Gentilly (FR)

( * ) Notice: Subject to any disclaimer, the term of this patent is extended or adjusted under 35 U.S.C. 154(b) by 375 days.

(21) Appl. No.: 09/361,700

(22) Filed: Jul. 27, 1999

(65) Prior Publication Data

US 2001/0045580 A1 Nov. 29, 2001

(30) Foreign Application Priority Data

Jul. 28, 1998 (FR) .......................................... 98 09801

(51) Int. Cl.⁷ .......................................... H01L 27/146
(52) U.S. Cl. .................... 257/292; 257/432; 257/440
(58) Field of Search ................. 257/292, 432, 257/440

(56) References Cited

U.S. PATENT DOCUMENTS

| | | | |
|---|---|---|---|
| 4,242,694 A | | 12/1980 | Koike et al. .................. 357/30 |
| 4,407,010 A | * | 9/1983 | Baji et al. .................... 257/292 |
| 4,630,091 A | | 12/1986 | Kuroda et al. |
| 4,996,578 A | * | 2/1991 | Motojima et al. .......... 257/432 |
| 5,084,747 A | * | 1/1992 | Miyawaki ................... 257/432 |
| 5,191,399 A | | 3/1993 | Maegawa et al. |
| 5,237,185 A | | 8/1993 | Udagawa et al. ........... 257/204 |
| 5,268,309 A | | 12/1993 | Mizutani et al. |
| 5,306,931 A | | 4/1994 | Stevens |
| 5,330,933 A | | 7/1994 | Chan et al. |
| 5,345,266 A | | 9/1994 | Denyer |
| 5,502,488 A | | 3/1996 | Nagasaki et al. ........... 348/300 |
| 5,538,207 A | | 7/1996 | Bordogna et al. |
| 5,580,701 A | | 12/1996 | Lur et al. |
| 5,591,997 A | | 1/1997 | Guidash et al. |
| 5,614,744 A | * | 3/1997 | Merrill ........................ 257/292 |
| 5,621,230 A | | 4/1997 | Guidash et al. |
| 5,747,835 A | | 5/1998 | Pezzani |
| 5,831,326 A | | 11/1998 | Chan et al. |
| 5,859,462 A | | 1/1999 | Tredwell et al. |

(Continued)

FOREIGN PATENT DOCUMENTS

| | | | |
|---|---|---|---|
| EP | A-0 152 353 | 8/1985 | ........... H01L/31/02 |
| EP | A-0 223 136 | 5/1987 | ............ G02B/5/28 |
| EP | 1 207 686 A1 | 5/2002 | |
| GB | 2 276 512 A | 9/1994 | |
| WO | WO 92/15036 A1 | 9/1992 | |

(Continued)

OTHER PUBLICATIONS

French Search Report from French Patent Application 98 09801, filed Jul. 28, 1998.

Patent Abstracts of Japan, vol. 009, No. 262 (P–398), Oct. 19, 1985 & JP–A–60 111225 (Matsushita Denki Sangyo KK).

(Continued)

Primary Examiner—Gene M. Munson
(74) Attorney, Agent, or Firm—Lisa K. Jorgenson; James H. Morris; Wolf, Greenfield & Sacks, P.C.

(57) ABSTRACT

An array of photodiodes includes regions of a second conductivity type formed in a semiconductive region of a first conductivity type, divided into three interleaved sub-arrays. All the photodiodes of a same sub-array are coated with a same interference filter including at least one insulating layer of determined thickness coated with at least one conductive layer. According to the present invention, the conductive layers are electrically connected to the semiconductive region of a first conductivity type.

16 Claims, 2 Drawing Sheets

U.S. PATENT DOCUMENTS

| | | | |
|---|---|---|---|
| 5,881,184 A | 3/1999 | Guidash | |
| 5,903,021 A | 5/1999 | Lee et al. | |
| 5,926,214 A | 7/1999 | Denyer et al. | |
| 5,945,722 A * | 8/1999 | Tsuei et al. | 257/432 |
| 5,949,061 A | 9/1999 | Guidash et al. | |
| 5,978,025 A | 11/1999 | Tomasini et al. | |
| 5,981,932 A | 11/1999 | Guerrieri et al. | |
| 5,982,011 A | 11/1999 | Kalnitsky et al. | |
| 5,986,297 A | 11/1999 | Guidash et al. | |
| 6,019,848 A | 2/2000 | Frankel et al. | |
| 6,049,118 A * | 4/2000 | Nagano | 257/432 |
| 6,051,447 A | 4/2000 | Lee et al. | |
| 6,067,113 A | 5/2000 | Hurwitz et al. | |
| 6,069,377 A | 5/2000 | Prentice et al. | |
| 6,087,703 A | 7/2000 | Ohta et al. | |
| 6,100,551 A | 8/2000 | Lee et al. | |
| 6,100,556 A | 8/2000 | Drowley et al. | |
| 6,107,655 A | 8/2000 | Guidash | |
| 6,127,697 A | 10/2000 | Guidash | |
| 6,133,954 A | 10/2000 | Jie et al. | |
| 6,150,683 A * | 11/2000 | Merrill et al. | 257/292 |
| 6,160,281 A | 12/2000 | Guidash | |
| 6,160,282 A * | 12/2000 | Merrill | 257/292 |
| 6,188,056 B1 | 2/2001 | Kalnitsky et al. | |
| 6,218,656 B1 | 4/2001 | Guidash | |
| 6,259,124 B1 | 7/2001 | Guidash | |
| 6,352,876 B1 | 3/2002 | Bordogna et al. | |
| 6,504,572 B2 | 1/2003 | Kramer et al. | |
| 2002/0019070 A1 | 2/2002 | Laurin et al. | |

FOREIGN PATENT DOCUMENTS

| | | |
|---|---|---|
| WO | WO 92/16999 A1 | 10/1992 |
| WO | WO 93/04556 A1 | 3/1993 |
| WO | WO 97/20434 A1 | 6/1997 |
| WO | WO 97/35438 A1 | 9/1997 |
| WO | WO 98/49729 A1 | 11/1998 |
| WO | WO 99/57887 A1 | 11/1999 |
| WO | WO 00/52765 A1 | 9/2000 |

OTHER PUBLICATIONS

Christopher Bencher, Chris Ngai, Bernie Roman, Sean Lian, Tam Vuong, Dielectric Antireflective Coatings for DUV Lithography, Solid State Technology, Mar. 1997, vol. 40, Issue 3, Copyright 1997 by PennWell Publishing Company.

R. Mehrotra, B.P. Mathur and S.Sharan, Reduction of the Standing Wave Effect in Positive Photoresist Using an Antireflection Coating, SPIE—The International Society for Optical Engineering, Mar. 1991, 487–491, vol. 1463, Published by the International Society for Optical Engineering.

Patent Abstracts of Japan, vol. 009, No. 061, Mar. 19, 1985 & JP 59 198756 A (Hitachi Seisakusho KK).

Patent Abstracts of Japan, vol. 1998, No. 03, Feb. 27, 1998 & JP 09 289301 A (Nikon Corp.) Nov. 4, 1997.

Patent Abstracts of Japan, vol. 1998, No. 09, Jul. 31, 1998 & JP 10 098175 A (Toshiba Corp.).

Patent Abstracts of Japan, vol. 2000, No. 11, Jan. 2, 2001 & JP 2000 236081 A (Nikon Corp.) Aug. 29, 2000.

Furumiya M. et al., "High Sensitivity and No–Cross–Talk Pixel Technology For Embedded CMOS Image Sensor" International Electron Devices Meeting 2000. IEDM. Technical Digest, San Francisco, CA, Dec. 10–13, 2000, New York, NY: IEEE, US, Dec. 10, 2000, pp. 701–704.

\* cited by examiner

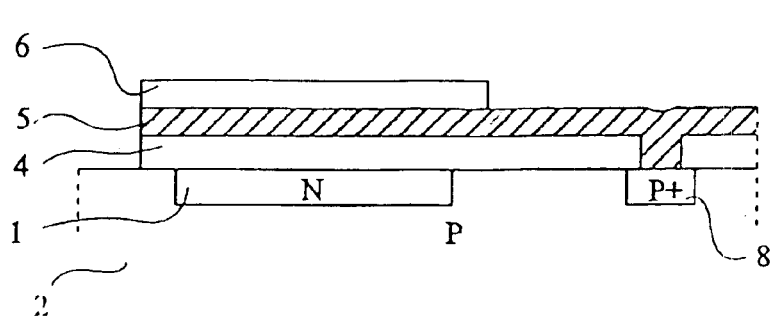
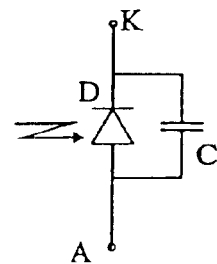
Fig 1A        Fig 1B
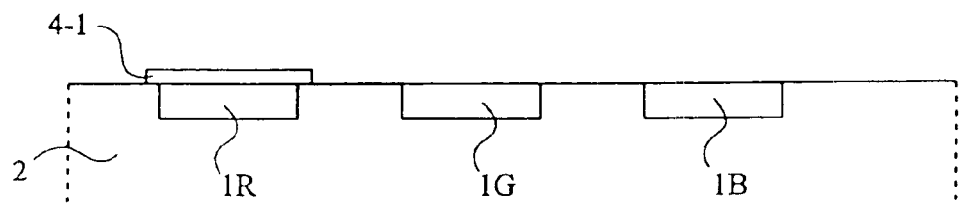
Fig 2A
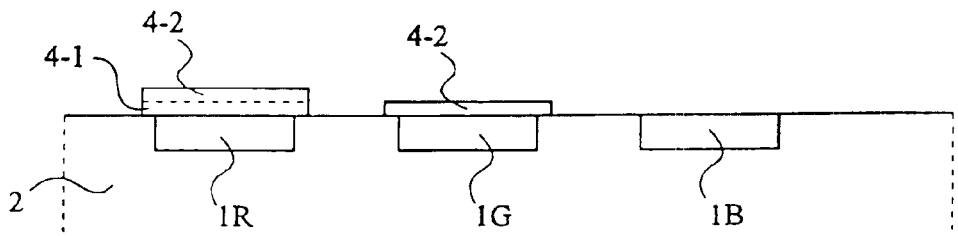
Fig 2B
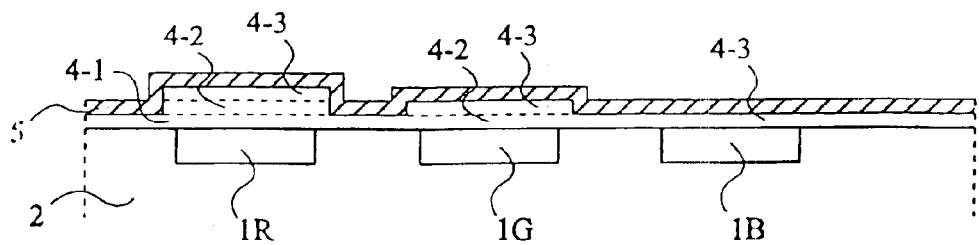
Fig 2C

IMAGE SENSOR WITH A PHOTODIODE ARRAY

BACKGROUND OF THE INVENTION

1. Field of the Invention

The present invention relates to the field of image sensors, usable for example in video cameras.

2. Discussion of the Related Art

Among the various techniques for converting an image projected on a target into electric data, targets formed of a semiconductor substrate supporting an array of photodiodes are used. The diodes are generally reverse-biased and capacitively charged. In the absence of light, they keep their charge and, when lit, they discharge. A bright image element or pixel can thus be differentiated from a dark pixel and an image in the form of a matrix of data corresponding to the electric charges of each of the pixels can thus be restored.

Further, it is known to form this matrix so that all pixels are divided into three sub-arrays corresponding to each of three colors (currently, red, green, and blue). For this purpose, each of the pixels, that is, each of the diodes, is coated with a color filter. It is known to use an interference filter as a color filter. Interference filters formed of materials compatible with usual MOS-type integrated circuit manufacturing lines have also been provided. Thus, an interference filter may be formed of a silicon oxide layer coated with a polysilicon layer, itself coated with a silicon nitride layer. In fact, the successive materials have to alternately have low and high optical indexes.

In such structures, the storage capacity of each pixel is associated with the pixel dimension and more specifically with the dimension of the junction of the associated diode.

SUMMARY OF THE INVENTION

An object of the present invention is to increase this storage capacity without increasing the dimension of an elementary cell of the sensor and without complicating its manufacturing.

To achieve this object as well as others, the present invention provides an array of photodiodes formed of regions of a second conductivity type formed in a semiconductive region of a first conductivity type, divided into three interleaved sub-arrays, all the photodiodes of a same sub-array being coated with a same interference filter including at least one insulating layer of determined thickness coated with at least one conductive layer. The conductive layers are electrically connected to the semiconductive region of a first conductivity type.

According to an embodiment of the present invention, the electric connection is indirect.

According to an embodiment of the present invention, the semiconductor substrate is a single-crystal silicon substrate, and the interference filter includes a silicon oxide layer formed above the substrate and a conductive polysilicon layer formed above the silicon oxide layer.

The foregoing objects, features and advantages of the present invention will be discussed in detail in the following non-limiting description of specific embodiments in connection with the accompanying drawings.

BRIEF DESCRIPTION OF THE DRAWINGS

FIG. 1A shows a simplified cross-sectional view of a pixel of a photodiode array according to the present invention;

FIG. 1B shows the equivalent diagram of the pixel of FIG. 1A;

FIGS. 2A, 2B, 2C illustrate successive steps of a method of realization of a layer of an interference filter used according to the present invention;

DETAILED DESCRIPTION

Figure 3:
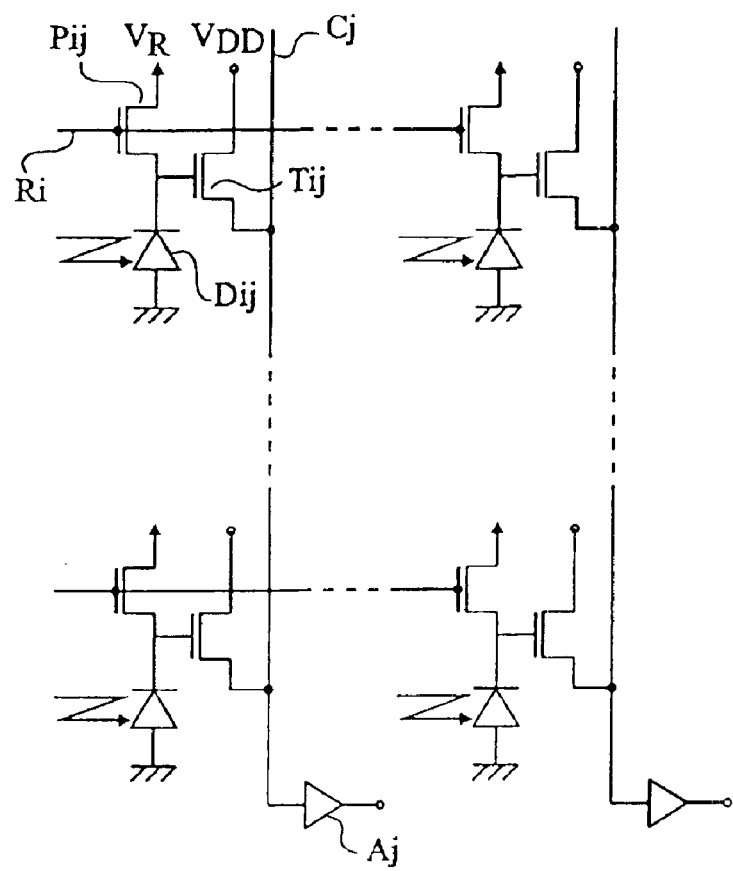
FIG. 3 shows in the form of a diagram an image sensor formed of a photodiode matrix according to the present invention.

It should be noted that, as usual in the field of the representation of semiconductor components, the various drawings are not drawn to scale but that the dimensions of their various elements have been arbitrarily modified to facilitate the readability and simplify the drawing.

FIG. 1A shows a cross-sectional view of a photodiode associated with an interference filter according to the present invention. This photodiode is formed of an N-type semiconductive region 1 formed in a P-type semiconductor substrate 2. It will be assumed herein that the substrate is made of single-crystal silicon. Above region 1 is formed a multiple layer deposition forming an interference filter and including, for example, a silicon oxide layer 4, a polysilicon layer 5, and a silicon nitride layer 6. For optical radiation in the visible field, single-crystal silicon and polysilicon have a high refraction coefficient, on the order of 4, while silicon oxide and silicon nitride have low coefficients, on the order of 1.5. In a known manner, the thicknesses of the different layers have to be adjusted to have a coated effect and a filtering effect adapted to a specific wavelength. For example, if layers 5 and 6 have respective thicknesses of 20 and 50 nm, a filter is formed for blue by choosing for oxide layer 4 a thickness on the order of 150 nm, a filter is formed for green with a thickness on the order of 190 nm, and a filter is formed for red with a thickness on the order of 230 nm.

According to the present invention, polysilicon layer 5 is not left floating but is set to the same potential as substrate 2. This is schematically illustrated in the drawing by a contact between layer 5 and a heavily-doped P-type region 8 of substrate 2. Polysilicon layer 5 is sufficiently doped to be well conductive; it may also be coated with a metal layer (aluminum) or be silicided, outside regions where it is useful to make a filter.

Due to the link between layer 5 and substrate 2, the structure corresponds to the equivalent diagram shown in FIG. 1B. It is assumed that cathode region 1 of photodiode D is connected to a terminal K not shown in FIG. 1A and that the anode of the photodiode is connected to a terminal A, currently grounded. The presence of conductive layer 5 connected to the substrate is equivalent to the existence of a capacitor C arranged in parallel on the diode. The first "plate" of the capacitor is formed of layer 5 connected to the substrate, that is, to the diode anode. The second "plate" of the capacitor corresponds to cathode region 1 of the diode.

The equivalent capacity of each diode is thus increased, that is, the storage capacity of each photoelement and thus, the dynamics of the electric signals resulting from a lighting, is increased. The linearity of the charge/voltage characteristic is also improved by adding a constant capacitance to the capacitance of the diode junction which is variable with the applied voltage.

FIGS. 2A to 2C illustrate an example of a method for forming oxide layers of different thicknesses over three groups of cathode regions 1R, 1G, 1B respectively sensitive to red, to green, and to blue.

In a first step illustrated in FIG. 2A, a first silicon oxide layer 4-1 is deposited and etched to maintain it in place only above regions 1R.

In a second step illustrated in FIG. 2B, a second silicon oxide layer 4-2 is deposited and etched to only leave it in place above regions 1R and 1G.

In a third step illustrated in FIG. 2C, a third silicon oxide layer 4-3 is deposited and left in place. After this, a polysilicon layer 5 and possibly, as previously described, a silicon nitride layer, are deposited. Then, the structure is properly etched to enable making contacts at selected locations.

The thickness of layer 4-3, in the case of the example given previously, is 150 nm, and the thicknesses of layers 4-1 and 4-2 are 40 nm so that oxide layers having respective thicknesses of 230, 190 and 150 nm are found above regions 1R, 1G, and 1B.

FIG. 3 partially shows as an example and in the form of a circuit the conventional structure of a photodiode array intended for forming an image sensor. Each photodiode Dij is connected by its anode to the ground and by its cathode to the source of a precharge transistor Pij, the drain of which is connected to a reference voltage VR and the gate of which is connected to a row line Ri meant to select all the transistors Pij of a same row. Thus, in a first phase, diodes Dij are precharged. Then, after lighting, the voltage across the diodes is read by means of an amplifier formed, for example, of a first transistor Tij, the gate of which is connected to the connection node of transistor Pij and diode Dij, the source of which is connected to a column line Cj and the drain of which is connected to a high voltage Vdd. Each line Cj is connected to an amplifier Aj forming for example with transistor Tij a follower amplifier.

In such a structure, each diode Dij can be of the type described in connection with FIGS. 1A–1B, that is including a diode in parallel with a capacitor (not shown in FIG. 3).

Figure 4:
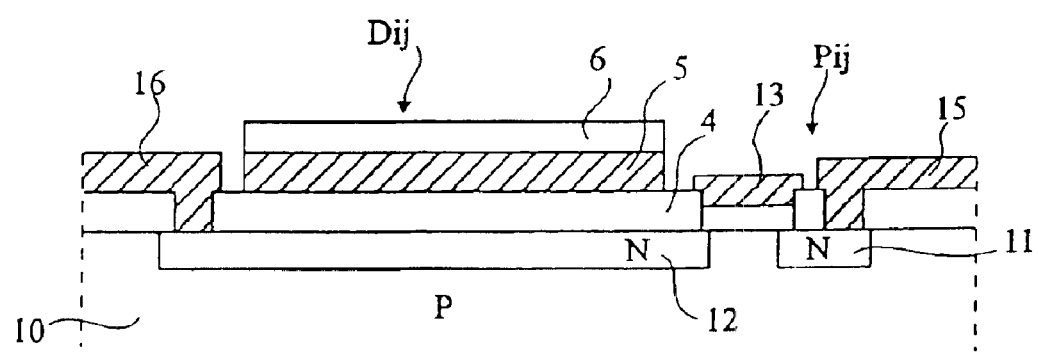
FIG. 4 shows an example of realization of a pixel of an image sensor according to FIG. 3.

An example of realization of a precharge transistor Pij and of a diode Dij is illustrated in FIG. 4. This structure is formed in a P-type single-crystal silicon substrate 10. Each transistor Pij includes an N-type drain region 11 and an N-type source region 12. Source region 12 extends to form the cathode region of diode Dij, the anode of which corresponds to substrate 10. Between the drain and the source of transistor Pij is formed an insulated gate 13, for example, made of polysilicon. The interference filter structure including layers 4, 5, and 6 already described in relation with FIG. 1 extends above most of region 12. Drain region 11 forms one piece with metallization 15 establishing a contact with a precharge voltage source VR.

Source/cathode region 12 forms one piece with a metallization 16 connected to the gate of transistor Tij (see FIG. 3). Further, and according to the present invention, polysilicon region 5 is connected to substrate 10. More currently, each of these regions will be connected to a common ground.

According to an alternative of the present invention, the diodes can be formed in a well itself formed in a substrate, that is, considering FIG. 4, P region 10 is a well formed in an N-type substrate not shown. In this case, polysilicon region 5 can be connected to the substrate and not directly to region 10.

Of course, the present invention is likely to have various alterations, modifications, and improvements which will readily occur to those skilled in the art. In particular, the various described materials may be replaced with equivalent materials. Other materials compatible with the manufacturing of semiconductor components may be used to make the interference filter formed above each diode. A significant feature of the present invention is that one layer of this interference filter, separated from the semiconductor substrate by an insulating layer, is conductive and is connected to the substrate. All the described types of conductivity may be inverted. Further, although a silicon substrate has been described, it should be noted that other semiconductor systems may be adapted to the implementation of the present invention.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An array of photodiodes made of regions of a second conductivity type formed in a semiconductive region of a first conductivity type, divided into three interleaved sub-arrays, each sub-array corresponding to a respective color of light, all photodiodes of a respective sub-array being coated with a same interference filter including at least one insulating layer of determined thickness coated with at least one conductive layer, a combined thickness of the at least one insulating layer and the at least one conductive layer being different for each sub-array, the determined thickness of said at least one insulating layer and said at least one conductive layer coating the respective sub-array determining the respective color of light that is interferentially filtered and provided to the respective sub-array, wherein the determined thickness of said at least one insulating layer is proportional to a wavelength of the color of light that is interferentially filtered, wherein said at least one conductive layer is electrically connected to the semiconductive region of the first conductivity type.

2. The array of photodiodes of claim 1, wherein the electric connection is indirect.

3. The array of photodiodes of claim 1, wherein the semiconductor substrate is a single-crystal silicon substrate, and the interference filter includes a silicon oxide layer formed above the substrate and a conductive polysilicon layer formed above the silicon oxide layer.

4. The array of photodiodes of claim 1, wherein the semiconductive region of the first conductivity type comprises a semiconductor substrate made of single-crystal silicon.

5. The array of photodiodes of claim 1, wherein said at least one insulating layer comprises a silicon oxide layer.

6. The array of photodiodes of claim 1, wherein said at least one conductive layer comprises a polysilicon layer.

7. The array of photodiodes of claim 1, further comprising a silicon nitride layer over said at least one conductive layer.

8. The array of photodiodes of claim 1, wherein said semiconductive region of the first conductivity type comprises a semiconductor substrate made of single-crystal silicon, said at least one insulating layer comprises a silicon oxide layer, and said at least one conductive layer comprises a polysilicon layer.

9. The array of photodiodes of claim 8, further comprising a silicon nitride layer over said at least one conductive layer.

10. The array of photodiodes of claim 9, wherein said single-crystal silicon layer and said polysilicon layer have a high refraction coefficient on the order of 4, while said silicon oxide layer and silicon nitride layer have a lower refract on coefficient, on the order of 1.5.

11. The array of photodiodes of claim 1, wherein said at least one conductive layer is connected to said semiconductive region of the first conductivity type at a heavily doped P-type region thereof.

12. The array of photodiodes of claim 1, wherein the at least one insulating layer includes a first insulating layer and a second insulating layer disposed below the first insulating layer, the first insulating layer extending across three photodiodes each in a different one of the three interleaved sub-arrays, and the second insulating layer extending across at least two photodiodes of the three photodiodes, wherein said at least on conductive layer extends across each of the three photodiodes above the first insulating layer.

13. The array of photodiodes of claim 12, wherein the at least one insulating layer further includes a third insulating layer, disposed below the second insulating layer, that extends across only one of the three photodiodes.

14. The array of photodiodes of claim 1, wherein said at least one insulating layer extends across three photodiodes each in a different one of the three interleaved sub-arrays, and wherein the determined thickness of said at least one insulating layer above each photodiode of the three photodiodes has a different thickness to interferentially filter a different wavelength of light.

15. The array of photodiodes of claim 1, wherein each of the photodiodes of each respective sub-array has a capacitance, and wherein said at least one conductive layer of the interference filter coating the respective sub-array forms a capacitance in parallel to the capacitance of each of the photodiodes of the respective sub-array.

16. The array of photodiodes of claim 1, wherein a thickness of said at least one conductive layer is substantially the same for each sub-array.

* * * * *

UNITED STATES PATENT AND TRADEMARK OFFICE
CERTIFICATE OF CORRECTION

PATENT NO. : 6,960,799 B2
DATED : November 1, 2005
INVENTOR(S) : Pierrick Descure It is certified that error appears in the above-identified patent and that said Letters Patent is hereby corrected as shown below:

Column 5,
Line 3, should read:
-- refraction coefficient, on the order of 1.5. --.
Line 15, should read:
-- said at least one conductive layer extends across each of the --.

Signed and Sealed this

Third Day of January, 2006

JON W. DUDAS
*Director of the United States Patent and Trademark Office*

UNITED STATES PATENT AND TRADEMARK OFFICE
CERTIFICATE OF CORRECTION

PATENT NO. : 6,960,799 B2 Page 1 of 1
DATED : November 1, 2005
INVENTOR(S) : Pierrick Descure It is certified that error appears in the above-identified patent and that said Letters Patent is hereby corrected as shown below:

<u>Title page,</u>
Item [73], Assignee, should read -- STMicroelectronics, S.A., Gentilly (FR) --.

Signed and Sealed this

Twenty-first Day of March, 2006

JON W. DUDAS
*Director of the United States Patent and Trademark Office*